United States Patent
Chandra et al.

(10) Patent No.: US 10,667,393 B2
(45) Date of Patent: May 26, 2020

(54) STEPPED VIAS FOR NEXT GENERATION SPEEDS

(71) Applicant: DELL PRODUCTS, L.P., Round Rock, TX (US)

(72) Inventors: Umesh Chandra, Santa Cruz, CA (US); Bhyrav M. Mutnury, Austin, TX (US); Mallikarjun Vasa, Secunderabad (IN)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/861,877

(22) Filed: Jan. 4, 2018

(65) Prior Publication Data
US 2019/0208632 A1 Jul. 4, 2019

(51) Int. Cl.
| H05K 1/11 | (2006.01) |
| H05K 1/02 | (2006.01) |
| H05K 3/10 | (2006.01) |
| H05K 3/00 | (2006.01) |

(52) U.S. Cl.
CPC ........... H05K 1/116 (2013.01); H05K 1/0219 (2013.01); H05K 1/0251 (2013.01); H05K 3/0088 (2013.01); H05K 3/10 (2013.01); H05K 1/115 (2013.01); H05K 3/0047 (2013.01); H05K 2201/09845 (2013.01); H05K 2203/0207 (2013.01)

(58) Field of Classification Search
CPC ................ H05K 1/115; H05K 1/0251; H05K 2201/09727; H05K 2201/096; H05K 1/0263; H05K 2201/09627; H05K 2201/09845; H01R 12/58
See application file for complete search history.

(56) References Cited

U.S. PATENT DOCUMENTS

| 5,038,252 A * | 8/1991 | Johnson ............... H05K 1/0263 174/251 |
| 6,181,219 B1 * | 1/2001 | Gailus ................... H05K 1/024 174/262 |
| 7,963,776 B1 * | 6/2011 | Morgan ................ H01R 12/52 174/262 |
| 8,158,892 B2 * | 4/2012 | Goergen .............. H05K 1/0216 174/250 |
| 9,024,208 B2 | 5/2015 | Mutnury et al. |
| 9,756,734 B2 | 9/2017 | Chen et al. |
| 2004/0118605 A1 * | 6/2004 | van der Laan ........ H05K 3/429 174/262 |

(Continued)

*Primary Examiner* — Roshn K Varghese
(74) *Attorney, Agent, or Firm* — Isidore PLLC

(57) ABSTRACT

A circuit board assembly of an information handling system has stepped diameter vias that carry communication signals through printed circuit board (PCB) substrates. Each stepped diameter via has a first barrel portion of a first diameter that is drilled through a first portion of the PCB substrates and that is at least lined with a conductive material to electrically conduct a selected one of: (i) a direct current and (ii) a communication signal from an outer layer to an internal layer of the more than one PCB substrate. Each stepped diameter via further includes a second barrel portion that extends from the first barrel portion deeper into the PCB substrates. The second barrel portion has a second diameter that is less than the first diameter and the smaller second diameter improves signal integrity (SI).

12 Claims, 9 Drawing Sheets

(56) References Cited

U.S. PATENT DOCUMENTS

| | | | |
|---|---|---|---|
| 2008/0160252 A1* | 7/2008 | Leon | H05K 1/115 |
| | | | 428/131 |
| 2008/0227311 A1* | 9/2008 | Chan | H05K 1/0216 |
| | | | 439/74 |
| 2010/0259338 A1 | 10/2010 | Jow et al. | |
| 2010/0319979 A1* | 12/2010 | Hsu | H05K 1/0251 |
| | | | 174/262 |
| 2013/0005160 A1* | 1/2013 | Minich | H01R 13/6471 |
| | | | 439/65 |
| 2014/0238733 A1* | 8/2014 | Mutnury | H05K 1/115 |
| | | | 174/266 |
| 2015/0014044 A1 | 1/2015 | Ao et al. | |
| 2015/0047188 A1* | 2/2015 | Thomas | H05K 3/427 |
| | | | 29/852 |
| 2015/0208514 A1* | 7/2015 | Thomas | H05K 3/429 |
| | | | 427/97.8 |
| 2017/0231091 A1 | 8/2017 | Berke et al. | |
| 2017/0231099 A1 | 8/2017 | Mundt et al. | |
| 2018/0077800 A1* | 3/2018 | Xiong | H05K 1/115 |

\* cited by examiner

300

| Layer | Layer Type | Finished Cu Wt | Thickness Backdrill | Depth | Tolerance | Er |
|---|---|---|---|---|---|---|
| Solder/Mask | | | 1.2 | 1.2 | | 3.2 |
| 1 | Top | 2oz+Plating | 4.2 | 5.4 | min 3.7 mil | |
| Prepreg | | | 6 | 11.4 | +/- 1 mil | 3.4 |
| 2 | Gnd | 1 oz | 1.35 | 12.8 | | |
| Core | | | 8 | 20.8 | +/- 1 mil | 3.4 |
| 3 | Inner1 | 1 oz | 1.35 | 22.1 | | |
| Prepreg | | | 8.5 | 30.6 | +/- 1 mil | 3.4 |
| 4 | GD2 | 1 oz | 1.35 | 32.0 | | |
| Core | | | 8 | 40.0 | +/- 1 mil | 3.4 |
| 5 | Inner2 | 1 oz | 1.35 | 41.3 | | |
| Prepreg | | | 8.5 | 49.8 | +/- 1 mil | 3.4 |
| 6 | GD3 | 1 oz | 1.35 | 51.2 | | |
| Core | | | 8 | | | +/- 1 mil | 3.4 |
| 7 | Inner3 | 1 oz | 1.35 | | | |
| Prepreg | | | 8.5 | | +/- 1 mil | 3.4 |
| 8 | GD4 | 1 oz | 1.35 | | | |
| Core | | | 8 | | +/- 1 mil | 3.4 |
| 9 | Inner4 | 1 oz | 1.35 | | | |
| Prepreg | | | 8.5 | | +/- 1 mil | 3.4 |
| 10 | GD5 | 1 oz | 1.35 | | | |
| Core | | | 8 | | +/- 1 mil | 3.4 |
| 11 | Inner5 | 1 oz | 1.35 | | | |
| Prepreg | | | 8.5 | | +/- 1 mil | 3.4 |
| 12 | GD6 | 1 oz | 1.35 | | | |
| Core | | | 8 | | +/- 1 mil | 3.4 |
| 13 | Inner6 | 1 oz | 1.35 | | | |
| Prepreg | | | 8.5 | | +/- 1 mil | 3.4 |
| 14 | GD7 | 1 oz | 1.35 | | | |
| Core | | | 8 | | +/- 1 mil | 3.4 |
| 15 | Inner7 | 1 oz | 1.35 | | | |
| Prepreg | | | 8.5 | | +/- 1 mil | 3.4 |
| 16 | GD8 | 1 oz | 1.35 | | | |
| Core | | | 8 | | +/- 1 mil | 3.4 |
| 17 | Inner8 | 1 oz | 1.35 | | | |
| Prepreg | | | 8.5 | | +/- 1 mil | 3.4 |
| 18 | GD9 | 1 oz | 1.35 | | | |
| Core | | | 8 | | +/- 1 mil | 3.4 |
| 19 | Inner9 | 1 oz | 1.35 | | | |
| Prepreg | | | 8.5 | | +/- 1 mil | 3.4 |
| 20 | GD10 | 1 oz | 1.35 | | | |
| Core | | | 8 | | +/- 1 mil | 3.4 |
| 21 | Inner10 | 1 oz | 1.35 | | | |
| Prepreg | | | 8.5 | | +/- 1 mil | 3.4 |
| 22 | GD11 | 1 oz | 1.35 | | | |
| Core | | | 8 | | +/- 1 mil | 3.4 |
| 23 | Inner11 | 1 oz | 1.35 | | | |
| Prepreg | | | 6 | | +/- 1 mil | 3.4 |
| 24 | Bottom | 2 oz+Plating | 4.2 | | min 3.7 mil | |
| SolderMask | | | 1.2 | | | 3.2 |

Connector Pin depth 312

Must cut layer 302

Must not cut layer 304

Back drilled 301

FIG. 3

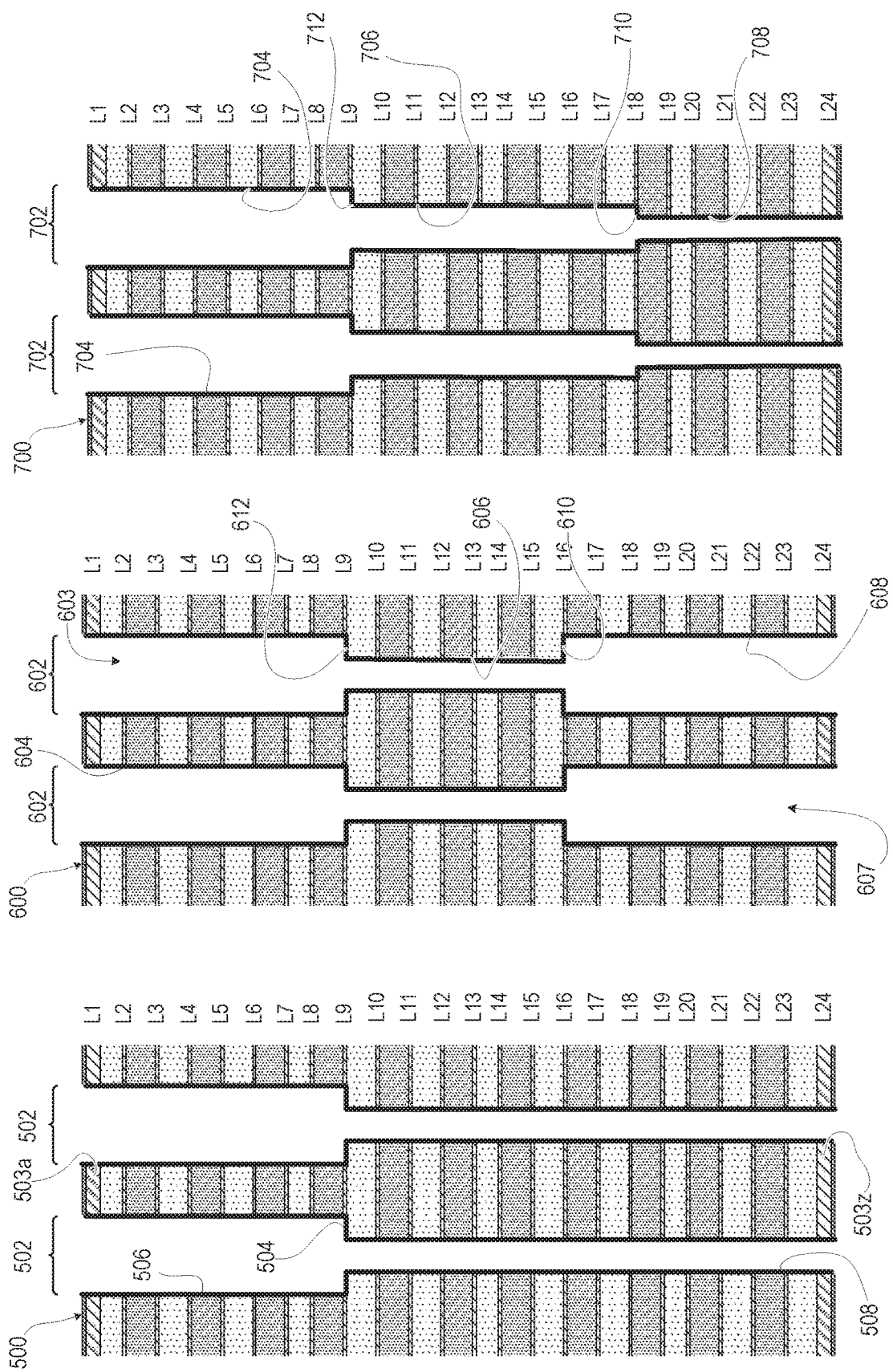

STEPPED VIAS FOR NEXT GENERATION SPEEDS

BACKGROUND

1. Technical Field

The present disclosure relates in general to circuit board assemblies in an information handling system (IHS), and more particularly to communication signal vias between printed circuit board (PCB) substrates of a circuit board assembly in an IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Vias connect signals from one layer to another in Printed Circuit Boards (PCBs) that are frequently used in IHSs. These signals can be direct current (DC) levels to high-speed communication signals. Many of the vias are only needed to pass through a portion of the PCB layers or substrates. Unused portions of the conducting material can extend past one of the connections to the via. The unused portion of the conducting material is a via stub that acts like a transmission line and starts resonating at a quarter wavelength of the communication signal. The resonance impacts channel insertion loss, resulting in loss of signal power. In addition to impacting insertion loss, via stubs also contribute to return loss of a channel due to reflections. The reflected signal from the via stub is delayed and added to the original signal, acting like a comb filter. The insertion and return losses of via stubs have a huge impact on signal integrity (SI). Signal distortion is practically impossible to undo at the receiver, leading to increased bit errors. Compounding the problem, PCB thicknesses and thus via stub lengths are growing as systems include more functionality and higher pin count devices.

High speed interfaces beyond 25 giga-bits per second (Gbps) are more sensitive to via resonances. Next-generation input/output (I/O) signaling speeds are expected to continue increasing to 32 Gbps, then to 56 Gbps, and further to 112 Gbps in the next few years. Minimizing the impact of interference caused by via stubs increases in importance concurrently with the increases in communication speeds. At current communication speeds, attempts to mitigate the effects of via stubs has focused on shortening the via stubs. For example, in recent generation of enterprise servers, the permissible length of via stubs has gone from 40 mils in twelfth generation (12G) servers to 12 mils in fourteenth generation (14G) servers. Due to practical limits on manufacturing tolerances, even reducing from 12 mils to 10 mils would be difficult.

BRIEF SUMMARY

In accordance with the teachings of the present disclosure, a circuit board assembly includes more than one printed circuit board (PCB) substrate and a stepped diameter via. The stepped diameter via includes a first barrel portion and a second barrel portion. The first barrel portion of a first diameter is drilled through a first portion of the more than one PCB substrate. The first barrel portion is lined with a conductive material to electrically conduct a selected one of: (i) a direct current and (ii) a communication signal from an outer layer to an internal layer of the more than one PCB substrate. The second barrel portion extends from the first barrel portion deeper into the more than one PCB substrates and has a second diameter that is less than the first diameter to improve signal integrity (SI).

According to aspects of the present innovation, an information handling system (IHS) includes a circuit board assembly having more than one PCB substrates and a stepped diameter via. The stepped diameter via includes a first barrel portion of a first diameter that is drilled through a first portion of the more than one PCB substrate. The first barrel portion is lined with a conductive material to electrically conduct a selected one of: (i) a direct current and (ii) a communication signal from an outer layer to an internal layer of the more than one PCB substrate. The stepped diameter via includes a second barrel portion that extends from the first barrel portion deeper into the more than one PCB substrate. The second barrel portion has a second diameter that is less than the first diameter to improve SI. A functional component of the circuit board assembly is electrically coupled to the stepped via. The functional component performs at least one of: (i) transmit; and (ii) receive a communication signal that is carried by the stepped diameter via.

According to illustrative embodiments of the present disclosure, a method is provided for making a circuit board assembly for an IHS. In one or more embodiments, the method includes forming a conductive pad on a selected substrate of more than one PCB substrate. The method includes assembling a circuit board assembly of the more than one PCB substrate with the selected substrate internally positioned. A first barrel portion of a first diameter is drilled through a first portion of the more than one PCB substrate. A second barrel portion is drilled that extends deeper into the more than one PCB substrate from the first barrel portion and has a second diameter that is less than the first diameter to improve SI. The method includes filling the first barrel portion and at least an adjacent portion of the second barrel portion with a conductive material to form a stepped diameter via. The stepped diameter via electrically couples an outer layer of the more than one PCB substrate with the conductive pad of the selected substrate.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 3 illustrates a table of dimensions of an example circuit board assembly that benefits from a stepped diameter via, according to one or more embodiments;

FIG. 5 illustrates a side cross-sectional diagrammatic view of a PCB with stepped diameter vias, according to one or more embodiments;

FIG. 6 illustrates a side cross-sectional diagrammatic view of a PCB with dual stepped diameter vias that are front and back drilled, according to one or more embodiments;

FIG. 7 illustrates a side cross-sectional diagrammatic view of a PCB with dual stepped diameter vias that are front drilled, according to one or more embodiments;

DETAILED DESCRIPTION

According to aspects of the present innovation, a circuit board assembly of an information handling system has stepped diameter vias that carry communication signals through printed circuit board (PCB) substrates. Each stepped diameter via has a first barrel portion of a first diameter that is drilled through a first portion of the PCB substrates and that is at least lined with a conductive material to electrically conduct a selected one of: (i) a direct current and (ii) a communication signal from an outer layer to an internal layer of the more than one PCB substrate. Each stepped diameter via further includes a second barrel portion from the first barrel portion that extends deeper into the PCB substrates. The second barrel portion has a second diameter that is less than the first diameter to improve signal integrity (SI).

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
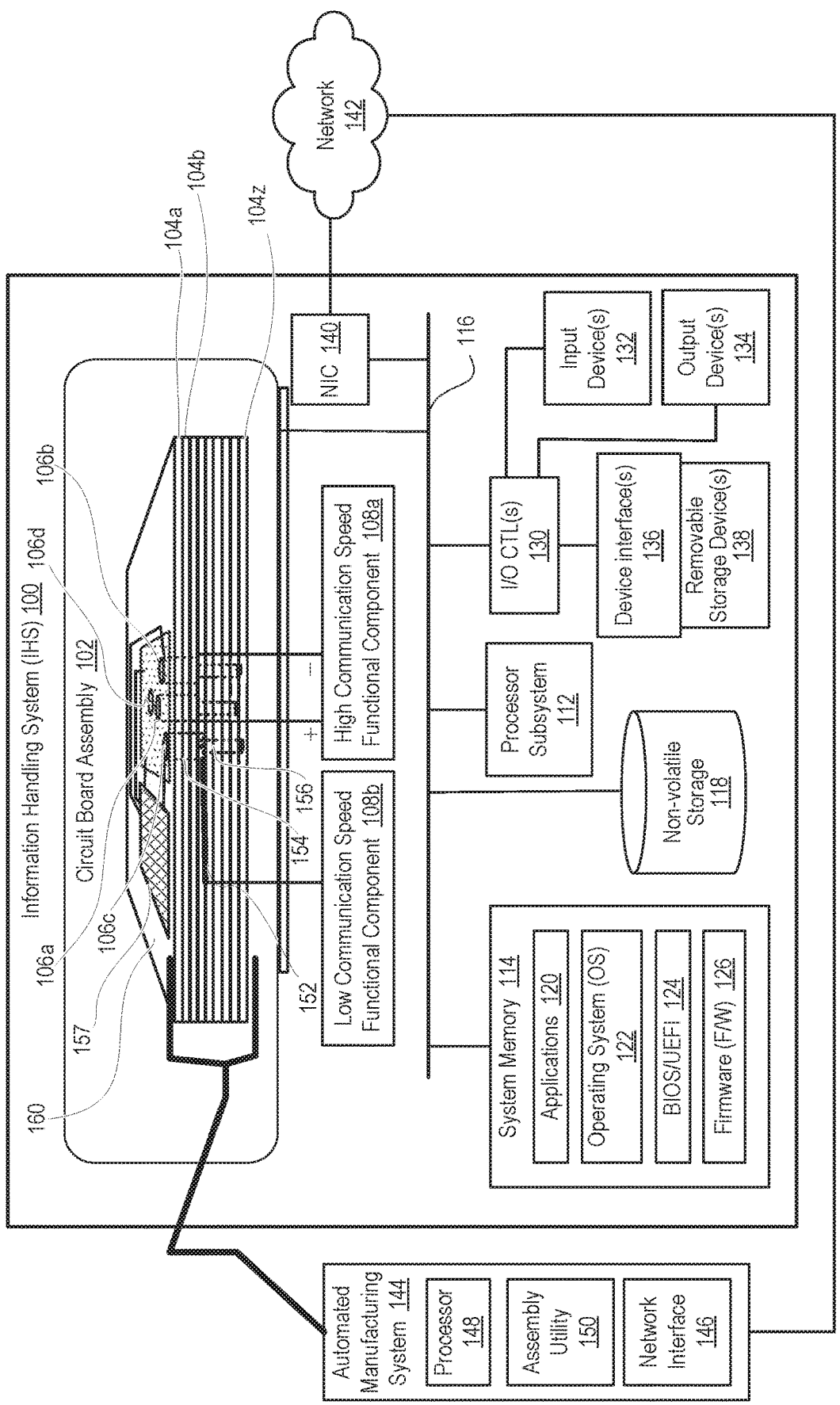
FIG. 1 illustrates a block diagram representation of an example information handling system (IHS) having a side cross-sectional diagrammatic view of a printed circuit board (PCB) with stepped diameter vias, according to one or more embodiments.

FIG. 1 illustrates a block diagram representation of an example information handling system (IHS) 100 having a circuit board assembly 102 of a stack of printed circuit board (PCB) substrates 104a-104z. The circuit board assembly 102 has stepped diameter vias 106a-106d that reduce the adverse effects of stub vias on signal integrity (SI). Pairs of stepped diameter vias 106a-106d can be used to differentially conduct a communication signal to a high communication speed functional component 108a. An individual stepped diameter via 106c can conduct a lower frequency signal to a low communication speed functional component 108b. Within the general context of IHSs, the IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring again to FIG. 1, IHS 100 has a processor subsystem 112 that is coupled to system memory 114 via system interconnect 116. System interconnect 116 can be interchangeably referred to as a system bus, in one or more embodiments. Also coupled to system interconnect 116 is non-volatile storage, e.g., a non-volatile random access memory (NVRAM) storage 118, within which can be stored one or more software and/or firmware modules and one or more sets of data that can be utilized during operations of management IHS 100. These one or more software and/or firmware modules can be loaded into system memory 114 during operation of management IHS 100. Specifically, in one embodiment, system memory 114 can include therein a plurality of such modules, including one or more of application(s) 120, operating system (OS) 122, basic input/output system (BIOS) or Uniform Extensible Firmware Interface (UEFI) 124, and firmware (F/W) 126. These software and/or firmware modules have varying functionality when their corresponding program code is executed by processor subsystem 112 or secondary processing devices within management IHS 100. For example, application(s) 120 may include a word processing application, a presentation application, and a management station application, among other applications.

IHS 100 further includes one or more input/output (I/O) controllers 130 which support connection by and processing of signals from one or more connected input device/s 132, such as a keyboard, mouse, touch screen, or microphone. I/O controllers 130 also support connection to and forwarding of output signals to one or more connected output devices 134, such as a monitor or display device or audio speaker(s). Additionally, in one or more embodiments, one or more device interfaces 136, such as an optical reader, a USB, a card reader, Personal Computer Memory Card International Association (PCMCIA) slot, and/or a high-definition multimedia interface (HDMI), can be associated with IHS 100. Device interface(s) 136 can be utilized to enable data to be read from or stored to corresponding removable storage device(s) 138, such as a compact disk (CD), digital video disk (DVD), flash drive, or flash memory card. In one or more embodiments, device interface(s) 136 can further include general purpose I/O interfaces such as inter-integrated circuit (I²C), system management bus (SMB), and peripheral component interconnect (PCI) buses.

IHS 100 comprises a network interface controller (NIC) 140. NIC 140 enables IHS 100 and/or components within IHS 100 to communicate and/or interface with other devices, services, and components that are located external to IHS 100. These devices, services, and components can interface with IHS 100 via an external network, such as example network 142, using one or more communication protocols that can include transport control protocol/internet protocol (TCP/IP) and network block device (NBD) protocol. Network 142 can be a local area network, wide area network, personal area network, and the like, and the connection to and/or between network and IHS 100 can be wired, wireless, or a combination thereof. For purposes of discussion, network 142 is indicated as a single collective component for simplicity. However, it should be appreciated that network 142 can comprise one or more direct connections to other devices as well as a more complex set of interconnections as can exist within a wide area network, such as the Internet.

The network 142 can also be connected to an automated manufacturing system 144 that communicates via a network interface 146. Automated manufacturing system 144 controls fabrication and assembly of circuit board assembly 102. A processor 148 can execute an assembly utility 150. Automated manufacturing system 144 makes a conductive pad 152 on a selected substrate 104a of the more than one PCB substrates 104a-104z. The automated manufacturing system 144 assembles the circuit board assembly 102 from a stack of PCB substrates 104 with the selected substrate 104a internally positioned. A first barrel portion 154 of a first diameter is drilled through a first portion of the more than one PCB substrates 104a-104z. A second barrel portion 156 is drilled from the first barrel portion 154 extending deeper into the more than one PCB substrates 104a-104z and has a second diameter that is less than the first diameter. The transition to the smaller second diameter helps to improve SI. The automated manufacturing system 144 fills the first barrel portion 154 and at least an adjacent portion of the second barrel portion 156 with a conductive material to form the stepped diameter via 106. The stepped diameter via 106 electrically couples a surface mount pad 157 on an outer layer 158 of the more than one PCB substrates 104a-104z with the conductive pad 152 of the selected substrate 104a. The resulting stepped diameter via 106 alters the via stub resonance making the stepped diameter via 106 useful for next generation I/O speeds. This approach is valuable both with and without back drilling to remove portions of the via stub.

Figure 2:
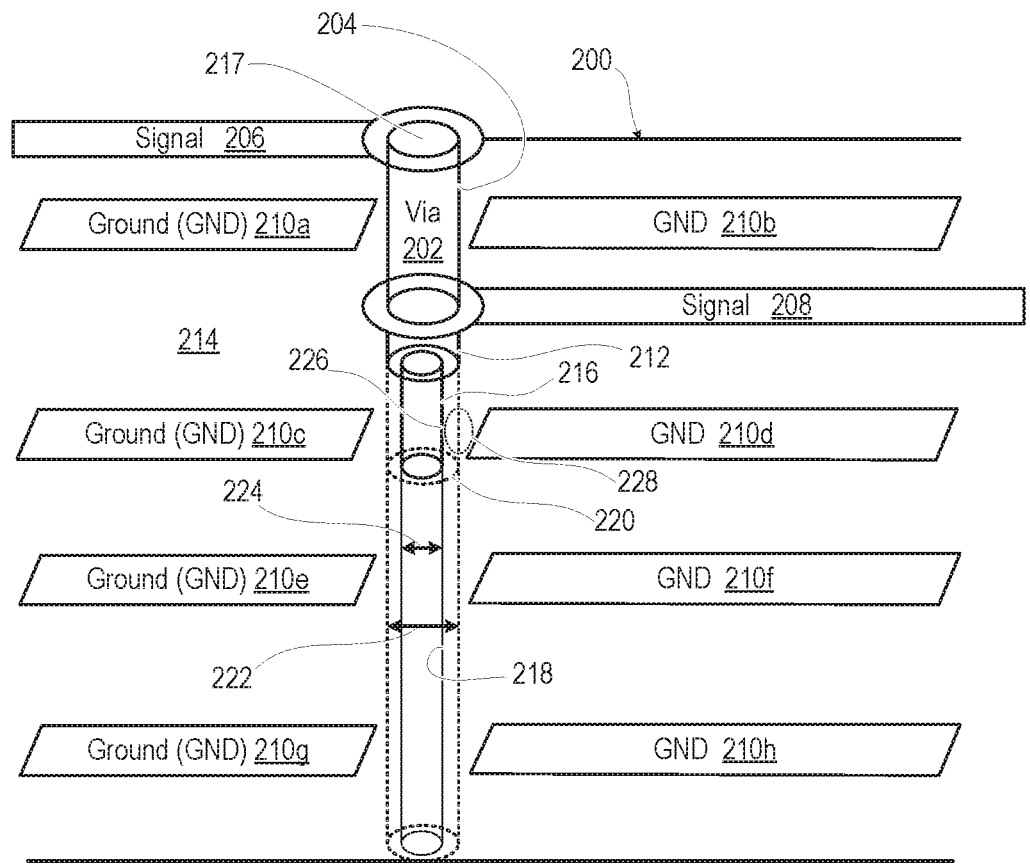
FIG. 2 illustrates a circuit board assembly having a one-step via, according to one or more embodiments.

FIG. 2 illustrates a circuit board assembly 200 having a one-step via 202 with an upper barrel portion 204 that connects an upper signal conductor 206 to a buried signal conductor 208. Ground conductors 210a, 210b terminate proximate to the upper barrel portion 204; however, signal integrity is maintained by anti-pad spacing. A via stub 212 extends deeper into a PCB substrate stack 214 of the circuit board assembly 200 and is proximate to ground conductors 210c, 210d. To reduce resonance issues, a second barrel portion 216 has a reduced diameter from the aligned and connected upper barrel portion 204. The reduced diameter of the connected second barrel portion 216 reduces the resonance as well as increases anti-pad spacing. In one or more embodiments, back drilling can be utilized to remove conductive material 217, creating a back drilled hole 218 up to a back drilling manufacturing tolerance 220, and leaving ground conductors 210e-210h significantly spaced from the via stub 212. The smaller via stub 212 also has a quarter wavelength dimension that resonates at higher frequencies. The change in diameter from a first diameter 222 to a smaller second diameter 224 changes the electromagnetic transmission characteristics of the via stub 212. The change in diameter also reduces capacitive coupling between via walls 226 and conductive planes, such as ground conductor 210d, by providing space for a larger antipad 228. This reduction in capacitance will result in faster rise times. Faster rise times and signal propagation tends to resonate at higher frequencies. This will result in via stub resonance happening at much higher frequencies.

FIG. 3 provides a table 300 illustrating dimensions of an example circuit board assembly that benefits from a stepped diameter via 106 (FIG. 1). Each row of the table 300 corresponds to a layer of the circuit board assembly and provides information as to function and thickness. Back drilling high speed PCB has become a necessity in order to support speeds beyond 16 Gbps. The smaller the via stub, the better electrical performance is realized. Unfortunately, even with a back drilled hole 301, a perfect '0' length via stub is not achievable. FIG. 3 illustrates that there is a certain amount of tolerance associated with back drilling. There is a "must cut" layer 302 that is reached from drilling from the front for the used portion of the via hole. There is also a "must not cut" layer 304 that is above an achievable back drilled hole 301. Layers 302, 304 are determined by the manufacturing tolerance. Achieving extremely tight manufacturing tolerances increases the cost, so 10-12 mils of via stub is still expected to be the limit for high volume manufacturing. An upper portion 308 of a stepped diameter via 310 can have a requirement for a width sufficient to receive a connector pin and have a connector pin depth 312.

Figure 4:
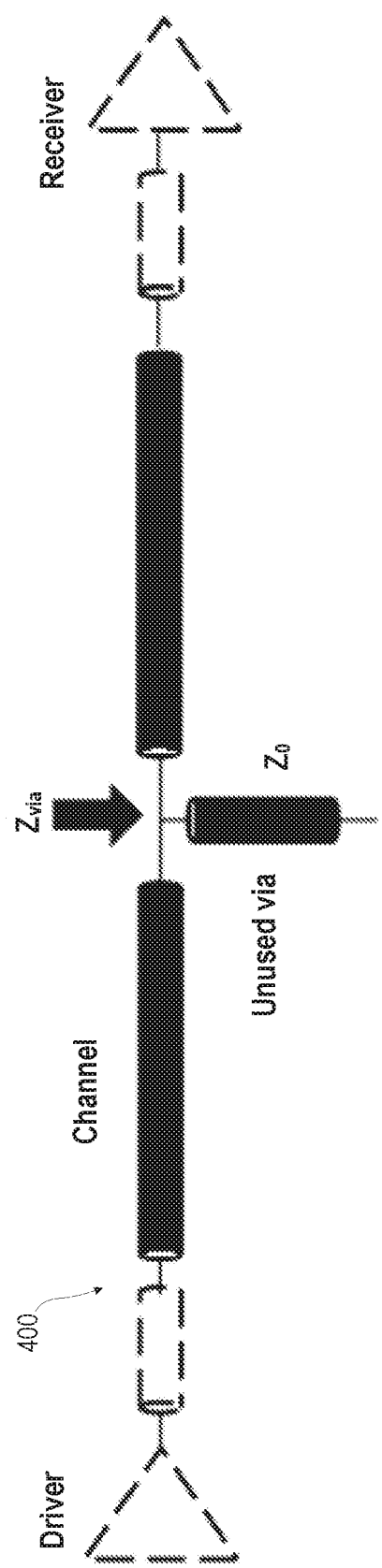
FIG. 4 illustrates an impedance model of a via with a via stub.

FIG. 4 illustrates an impedance model 400 of a via with a via stub. When a 10-12 mil via stub exists, the via stub results in a resonance which corresponds to the quarter wave length. As the speeds continue to increase to 25 Gbps to 32 Gbps to 56 Gbps and beyond, this small via stub will continue to impact the quality of the signal. It will not only increase the insertion loss but will also result in a higher return loss.

FIG. 5 illustrates an example of a PCB. PCB 500 is similar to the stepped diameter via 310 described in table 300 (FIG. 3) with a differential pair of stepped diameter via holes 502 formed through PCB layers 503a-503z. A step 504 between a wider diameter upper barrel portion 506 and a narrower lower barrel portion 508 causes the resonance frequency to push farther away into a higher frequency to avoid impacting SI. The cross sectional area of the respective barrel portion 506, 508 changes at step 504. The ability of the respective barrel portion 506, 508 to conduct a signal thus changes as a function of the change in circumference and cross sectional area at step 504. A change in impedance causes a reflection (insertion and return loss) at step 504, limiting the amount of power that enters the narrower lower barrel portion 508. With less received signal, the amount of energy that can radiate from the narrower lower barrel portion 508 is reduced. Step 504 provides an improvement with or without back drilling of the via stub. Narrow vias with 5-6 mils diameter are not possible for thick PCB boards of more than 62 mils due to drilling aspect ratio constraints. Aspect ratios are typically around 10:1 to 12:1 today. Due to the aspect ratio constraint, it is not possible to have vias with 14 mil diameter when the boards are 150+ mils thick. On top of these considerations, most connector pins need wider via diameter (20 mils), making it difficult to have narrow vias in PCB design. According to the present innovation, the stepped diameter via hole 502 satisfies the need for an adequate aspect ratio and at the same time SI is improved. Usually, backplanes, midplanes and switch boards are 120 to 220 mils thick. The present innovation satisfies aspect ratios constraints sufficiently for these dimensions. Thus, the stepped via construction meets both the connector mating pin requirement for mechanical retention along with meeting SI criteria to avoid stub resonance. After the connector depth requirement is met, such as 50 mils for the connector pin, the PCB designer can select a narrower via diameter for the rest of the thickness of the PCB 500 without violating the aspect ratio restriction for certain thicknesses of PCBs.

For even thicker boards, the "one-step" via may not sufficiently provide for a required aspect ratio. When a deeper hole is required, the top of the hole needs to be wider than the bottom of the hole, according to an aspect ratio, to prevent drill bit failure. FIG. 6 illustrates a PCB 600 with a different pair of "two-step" via holes 602 which provides for additional aspect ratio accommodation. A front drilled portion 603 of two-step via hole 602 only has to progress through about half of the PCB 600 to form an upper first barrel portion 604 and perhaps some or all of a middle second barrel portion 606 that has a narrower diameter. A back drilled portion 607 forms a bottom third barrel portion 608 that is wider than the middle second barrel portion 606. In addition to handling issues with the aspect ratio, an introduced second step 610 in addition to a first step 612 has a similar effect on pushing off a resonance frequency to a higher frequency. In one or more embodiments, the bottom third barrel portion 608 can be formed after filling the two-step via holes 602 with conductive material. Drilling the bottom third barrel portion removes a portion of the via stub. Even for the same thickness of PCB 600, forming the two-step via holes 602 allows making the diameter of the upper first barrel portion 604 smaller than if the front drilling was required to go all the way through the PCB 600.

FIG. 7 illustrates a PCB 700 having a differential pair of two-step via holes 702 that each have an upper first barrel portion 704, a narrower middle second barrel portion 706, and a narrowest bottom third barrel portion 708. Steps 710, 712 between respective upper middle and bottom barrel portions 704, 706, 708 provide an improvement in SI. The two-step via holes 702 comply with drilling aspect ratio constraints from a front only drilled hole. The narrowest bottom third barrel portion 708 enables greater spacing from conductors for greater capacitance and thus higher resonance frequency.

Figure 8:
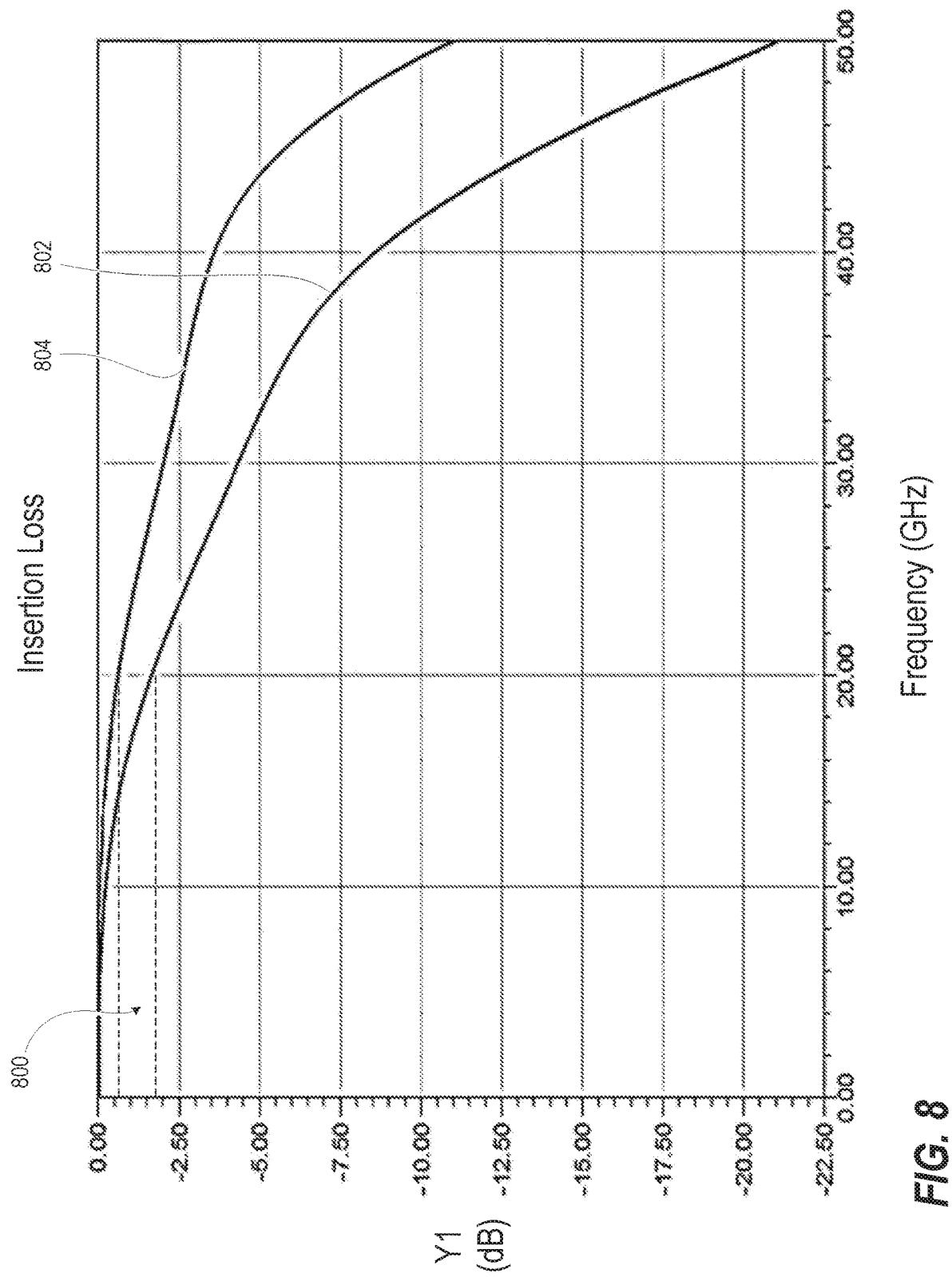
FIG. 8 illustrates a graphical plot by a High Frequency Structure Simulator (HFSS) of insertion loss comparing a conventional via stub to a stepped diameter via stub, according to one or more embodiments.

FIG. 8 illustrates a graphical plot 800 by a High Frequency Structure Simulator (HFSS) of insertion loss as a function of frequency, comparing a first trace 802 for a conventional back drilled via stub of 15 mils with a second trace 804 for a stepped via, according to aspects of the present innovation. Insertion loss is the loss of signal power resulting from the insertion of a device in a transmission line. Insertion loss is represented as the ratio of transmit power to resulting power expressed in decibels (dB). Full transmission is thus a "0" value, as both traces 802, 804 illustrate at lower frequencies below 10 GHz. With increasing frequency, trace 802 shows an increasing amount of insertion loss as compared to trace 804, with about 2.5 dB at 30 GHz, about 5 dB at 40 GHz, and about 10 dB at 50 GHz. Therefore, the addition of the stepped feature has a significant improvement on insertion loss at higher communication speeds, and thus an improvement in SI.

Figure 9:
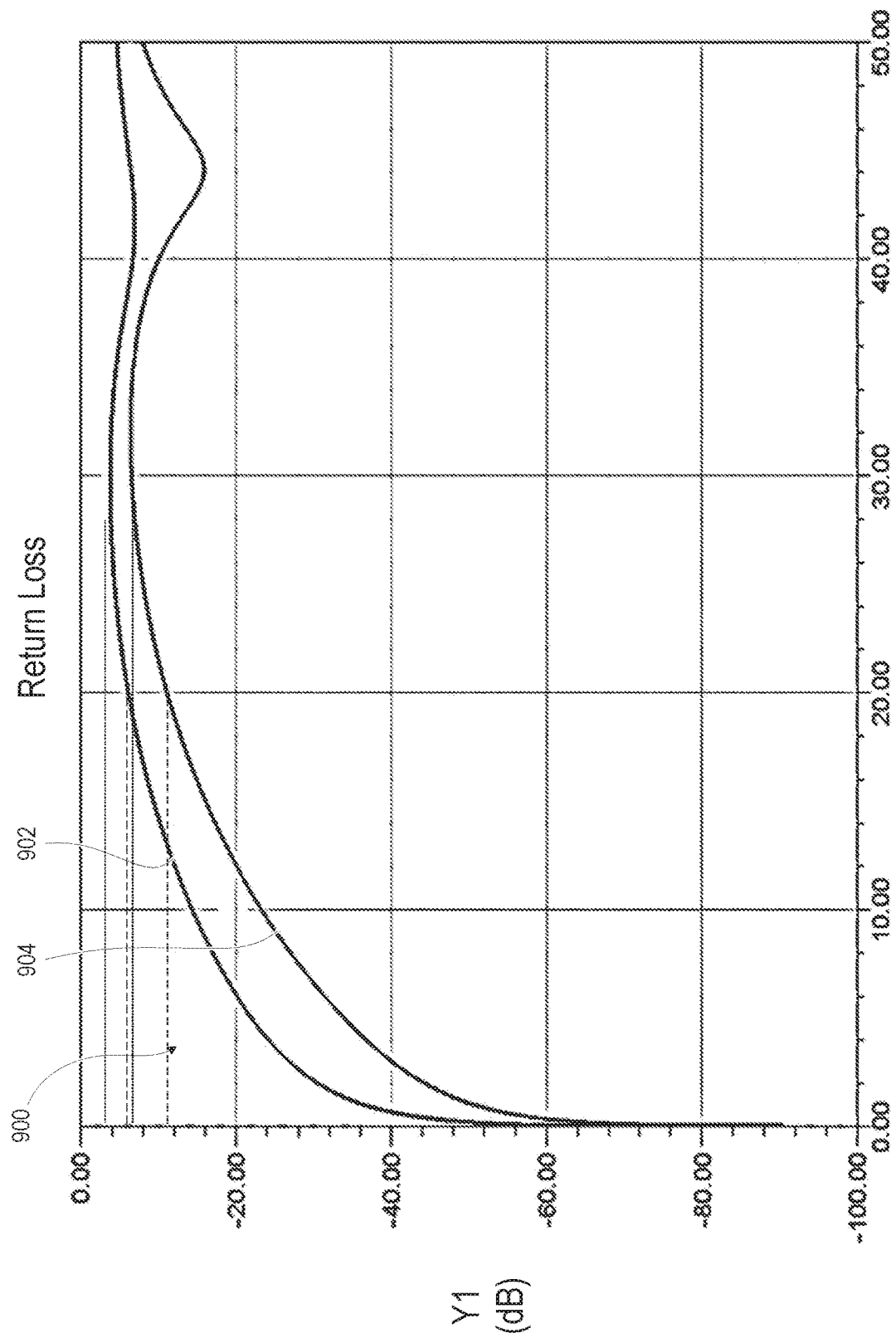
FIG. 9 illustrates a graphical plot by a HFSS of return loss comparing a conventional via stub to a stepped diameter via stub, according to one or more embodiments.

FIG. 9 illustrates a graphical plot 900 by a High Frequency Structure Simulator (HFSS) of insertion loss as a function of frequency, comparing a first trace 902 for a conventional via stub of 15 mils with a second trace 904 for a stepped via, according to aspects of the present innovation. Return loss is related to both standing wave ratio (SWR) and reflection coefficient (F). Increasing return loss corresponds to lower SWR. Return loss is a measure of how well devices or lines are matched. A match is good if the return loss is high. A high return loss is desirable and results in a lower insertion loss. Return loss is used in modern practice in preference to SWR because return loss has better resolution for small values of reflected wave. Graphical plot 900 indicates an insertion loss improvement at least up to 50 GHz using HFSS simulator. For example, an insertion loss improvement of 6 dB (200%) between first and second traces 902, 904 is illustrated at 20 GHz.

Figure 10:
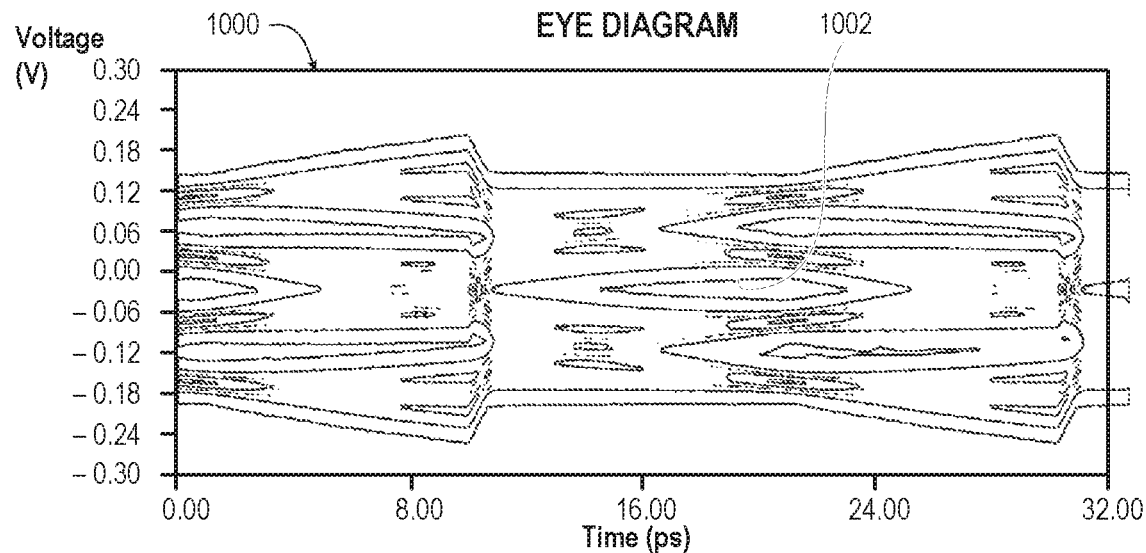
FIG. 10 illustrates a graphical plot by a HFSS of a data eye diagram of a conventional via stub.
Figure 11:
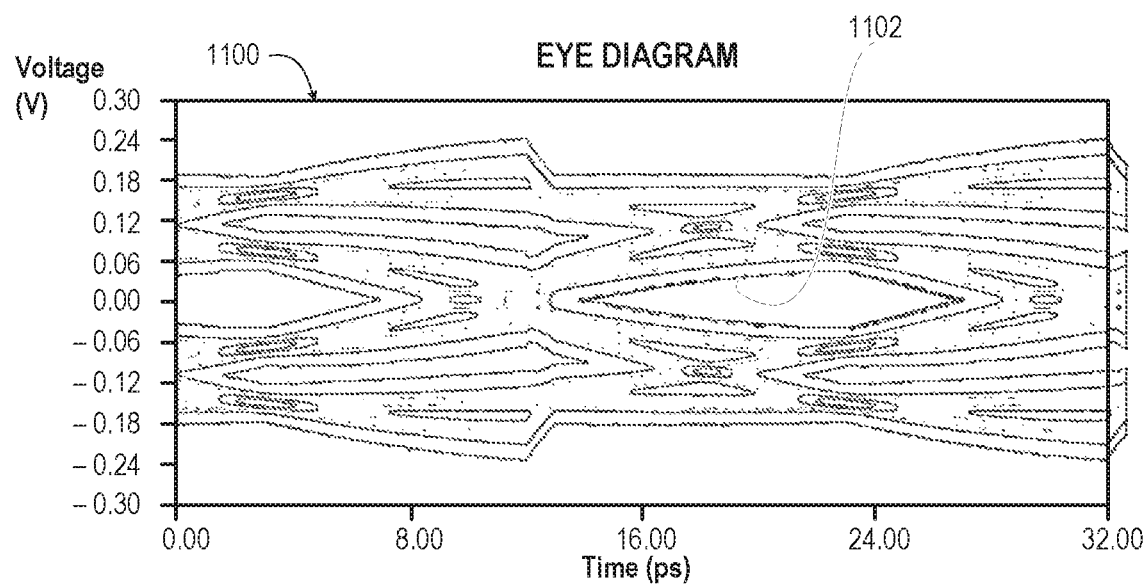
FIG. 11 illustrates a graphical plot by a HFSS of a data eye diagram of a stepped diameter via stub, according to one or more embodiments.

FIG. 10 illustrates graphical plot 1000 for a data eye diagram of a conventional back drilled via stub of 15 mils simulated at 50 GHz. A small or collapsed eye shape 1002 represents poor SI. FIG. 11 illustrates graphical plot 1100 for a data eye diagram of a stepped diameter via stub, according to aspects of the present disclosure, simulated at 50 GHz. The data eye diagram is a methodology to represent and analyze a high speed digital signal. The eye diagram allows key parameters of the electrical quality of the signal to be quickly visualized and determined. The data eye diagram is constructed from a digital waveform by folding the parts of the waveform corresponding to each individual bit into a single graph with signal amplitude on the vertical axis and time on horizontal axis. By repeating this construction over many samples of the waveform, the resultant graph will represent the average statistics of the signal and will resemble an eye. The eye opening corresponds to one bit period and is typically called the Unit Interval (UI) width of the eye diagram. The data eye diagram is a time domain simulation that quantifies the improvement in eye opening. A larger eye shape 1102 represents significantly improved SI as compared to having no eye with conventional back drilled vias with 15 mils stub.

Figure 12:
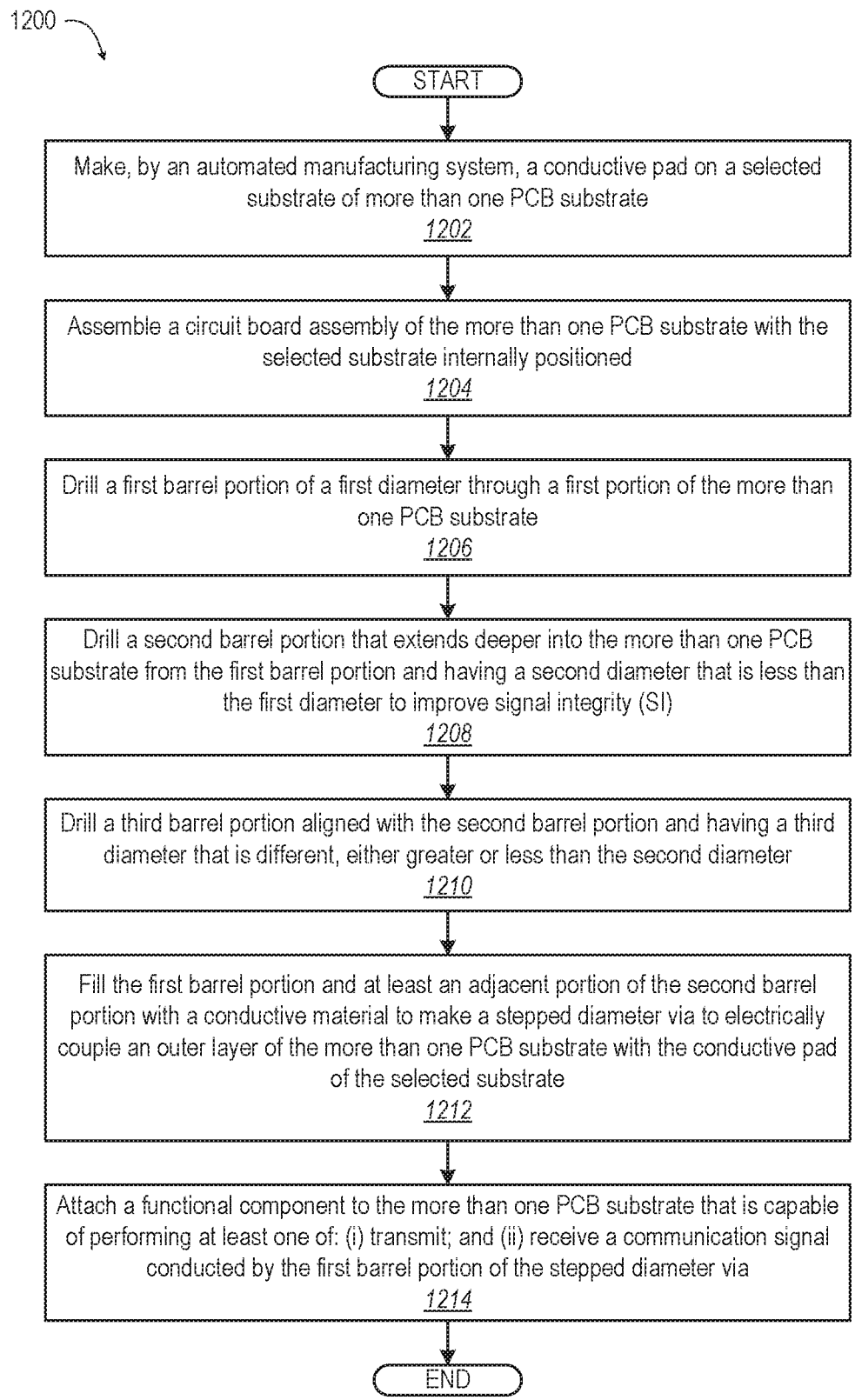
FIG. 12 illustrates a flow diagram of a method of manufacturing a PCB with a stepped diameter via, according to one or more embodiments.

FIG. 12 illustrates a method 1200 of an automated manufacturing system making a PCB with a stepped via, according to one or more embodiments of the disclosure. In one or more embodiments, method 1200 begins with an automated manufacturing system making a conductive pad on a selected substrate of more than one PCB substrates (block 1202). Method 1200 includes assembling a circuit board assembly of the more than one PCB substrates with the selected substrate internally positioned (block 1204). A first barrel portion of a first diameter is drilled through a first portion of the more than one PCB substrates (block 1206). Method 1200 includes drilling a second barrel portion that extends from the first barrel portion deeper into the more than one PCB substrates and having a second diameter that is less than the first diameter to improve signal integrity (SI) (block 1208). In one or more embodiments, a third barrel portion aligned with the second barrel portion is drilled having a third diameter that is different from, i.e., either greater or less than, the second diameter (block 1210). If the third diameter is smaller, the third barrel portion can be drilled from either side. If the third diameter is greater, the third barrel portion is drilled from an opposite side of the more than one PCB substrates than the first barrel portion. Method 1200 includes filling the first barrel portion and at least an adjacent portion of the second barrel portion with a conductive material to form a stepped diameter via to electrically couple an outer layer of the more than one PCB substrates with the conductive pad of the selected substrate (block 1212). Method 1200 includes attaching a functional component to the more than one PCB substrate, the functional component capable of performing at least one of: (i) transmit; and (ii) receive a communication signal conducted by the first barrel portion of the stepped diameter via (block 1214). Then method 1200 ends.

The steps in diameter of the via improve signal integrity, mitigating an effect of an unused via stub acting as a monopole antenna at high communication speeds. Having a greater diameter outboard of an inner smaller diameter barrel portion provides a required drilling aspect ratio in order to manufacturer a PCB with a large number of substrates, such as are commonly used in information handling systems, such as servers. Back drilling with a larger diameter third parallel portion can be used to remove conducting material to make the via stub shorter. Antipad spacing for improved SI can be enhanced by having the additional lateral spacing provided by a smaller diameter portion of the stepped diameter via.

In one or more embodiments, the first diameter is sufficient for at least a width of a connector pin. In one or more embodiments, the first diameter is sufficient for at least a drilling aspect ratio required by a thickness of the more than one PCB substrates and the second diameter. In one or more embodiments, method 1200 includes, from an opposite side of the more than one PCB substrates than the first barrel portion, drilling a third barrel portion aligned with the second barrel portion and having a third diameter greater than the second diameter to provide a drilling aspect ratio required by a thickness of the more than one PCB substrates and the second diameter.

In one or more embodiments, the method 1200 achieves an increase in stub resonance frequency, allowing improved SI at increased communication speeds. The method 1200 can be used to construct both single step and dual stepped vias with scaling used as appropriate for drilling aspect ratio and desired performance. The number of via steps and diameters selected can accommodate and be based on the stack-up thickness, material, and frequency of operation. The method 1200 can be used both in combination with back drilling if needed or to avoid back drilling to save cost depending on the signaling speeds. For example, back drilling becomes unnecessary for signaling speeds below 25 Gbps. The present method 1200 can be combined with other practices for PCB and via construction to maximize the stub reduction effect, like tuning pad and antipad sizes and via terminations.

In the above described flow chart of FIG. 12, one or more of the methods may be embodied in an automated manufacturing controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof.

Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A circuit board assembly comprising:
   more than one printed circuit board (PCB) substrate comprising an upper signal conductor, a buried signal conductor, and a plurality of ground conductors including upper ground conductors and lower ground conductors;
   a plurality of stepped diameter vias each comprising:
      a first barrel portion of a first diameter that is drilled through a first upper portion of the more than one PCB substrate and that is at least lined with a conductive material to electrically conduct a selected one of: (i) a direct current and (ii) a communication signal from an outer layer having the upper signal conductor to an internal layer of the more than one PCB substrate, the internal layer having the buried signal conductor, the upper ground conductors terminating proximate to the first barrel portion, with signal integrity maintained by anti-pad-spacing; and
      a second barrel portion that extends from the first barrel portion deeper into the more than one PCB substrate and that has a second diameter that is less than the first diameter, the second barrel portion being proximate to the lower ground conductors, wherein the second diameter being less than the first diameter increases anti-pad spacing changes electromagnetic transmission characteristics of the second barrel portion, reduces capacitive coupling between via walls and conductive planes by providing space for a larger antipad, and reduces resonance, which improves signal integrity, wherein the second barrel portion is a via stub that has a quarter wavelength dimension;
   wherein the upper barrel portion connects the upper signal conductor to the buried signal conductor to electrically couple an outer layer of the more than one PCB substrates with a conductive pad of a selected substrate; and
   wherein the plurality of stepped diameter vias comprises both:
      at least one pair of stepped diameter vias to differentially conduct a communication signal to a high communication speed functional component, supporting communication speeds beyond 25 gigabits per second (Gbps); and
      at least one individual stepped diameter via that conducts a lower frequency signal to a low communication speed functional component.

2. The circuit board assembly of claim 1, wherein the first diameter is at least a width of a connector pin and the first barrel portion has a connector pin depth and enables insertion of the connector pin, wherein the first barrel portion meets both the connector mating pin requirement for mechanical retention along with avoiding stub resonance.

3. The circuit board assembly of claim 1, wherein the first diameter is at least a drilling aspect ratio required by a thickness of the more than one PCB substrate and the second diameter.

4. The circuit board assembly of claim 1, further comprising a third barrel portion aligned with and drilled from an opposite side of the more than one PCB substrate than the first barrel portion, the third barrel portion having a third diameter equal to or greater than the second diameter, the third barrel portion being created by back drilling to remove conductive material from at least a lower portion of the second barrel portion, the back drilling creating a back drilled hole up to a back drilling manufacturing tolerance, the back drilled hole leaving ground conductors significantly spaced from the second barrel portion.

5. The circuit board assembly of claim 1, further comprising a third barrel portion aligned with the second barrel portion and drilled from an opposite side of the more than one PCB substrate than the first barrel portion, the third barrel portion having a third diameter greater than the second diameter to provide a drilling aspect ratio required by a thickness of the more than one PCB substrate and the second diameter, wherein back-drilling the third barrel portion makes the diameter of the upper first barrel portion smaller than a diameter of another first barrel portion that is created via front drilling all the way through the PCB.

6. The circuit board assembly of claim 1, further comprising a third barrel portion aligned and on an opposite end of the second barrel portion than the first barrel portion, the third barrel portion having a third diameter that is less than the second diameter to improve SI, the third barrel portion with the third diameter providing greater spacing from conductors for greater capacitance, thus enabling higher resonance frequency, wherein a number of via steps and diameters selected for each barrel portion are based on a stack-up thickness of the PCB, material of the PCB, and desired frequency of operation.

7. An information handling system (IHS) comprising:
   a circuit board assembly comprising:
      more than one printed circuit board (PCB) substrate comprising an upper signal conductor, a buried signal conductor, and a plurality of ground conductors including upper ground conductors and lower ground conductors;
      a plurality of stepped diameter vias each comprising:
         a first barrel portion of a first diameter that is drilled through a first upper portion of the more than one PCB substrate and that is at least lined with a conductive material to electrically conduct a selected one of: (i) a direct current and (ii) a communication signal from an outer layer having the upper signal conductor to an internal layer of the more than one PCB substrate, the internal layer having the buried signal conductor, the upper ground conductors terminating proximate to the first barrel portion, with signal integrity maintained by anti-pad-spacing; and a second barrel portion that extends from the first barrel portion deeper into the more than one PCB substrate and that has a second diameter that is less than the first diameter, the second barrel portion being proximate to the lower ground conductors, wherein the second diameter being less than the first diameter increases anti-pad spacing, changes electromagnetic transmission characteristics of the second barrel portion, reduces capacitive coupling between via walls and conductive planes by providing space for a larger antipad, and reduces resonance, which improves signal integrity, wherein the second barrel portion is a via stub that has a quarter wavelength dimension;

wherein the upper barrel portion connects the upper signal conductor to the buried signal conductor to electrically couple an outer layer of the more than one PCB substrates with a conductive pad of a selected substrate;

wherein the plurality of stepped diameter vias comprises both:

at least one pair of stepped diameter vias to differentially conduct a communication signal to a high communication speed functional component, supporting communication speeds beyond 25 gigabits per second (Gbps); and at least one individual stepped diameter via that conducts a lower frequency signal to a low communication speed functional component; and a functional component electrically coupled to one of an individual stepped diameter via or a pair of stepped diameter vias that performs at least one of: (i) transmit; and (ii) receive a communication signal that is carried by a corresponding one of the individual stepped diameter via or the pair of stepped diameter vias at a corresponding communication speed.

8. The IHS of claim 7, wherein the first diameter is at least a width that enables insertion of a connector pin.

9. The IHS of claim 7, wherein the first diameter is at least a drilling aspect ratio required by a thickness of the more than one PCB substrate and the second diameter.

10. The IHS of claim 7, further comprising a third barrel portion aligned with and on an opposite end the second barrel portion than the first barrel portion, the third barrel portion having a third diameter equal to or greater than the second diameter, the third barrel portion being created by back drilling to remove conductive material from at least a lower portion of the second barrel portion, the back drilling creating a back drilled hole up to a back drilling manufacturing tolerance, the back drilled hole leaving ground conductors significantly spaced from the second barrel portion.

11. The IHS of claim 7, further comprising a third barrel portion aligned with the second barrel portion and drilled from an opposite side of the more than one PCB substrate than the first barrel portion, the third barrel portion having a third diameter greater than the second diameter to provide a drilling aspect ratio required by a thickness of the more than one PCB substrate and the second diameter, wherein back-drilling the third barrel portion makes the diameter of the upper first barrel portion smaller than a diameter when the upper first barrel portion is created via front drilling all the way through the PCB.

12. The IHS of claim 7, further comprising a third barrel portion aligned and on an opposite end the second barrel portion than the first barrel portion, the third barrel portion having a third diameter that is less than the second diameter to improve SI, the third barrel portion with the third diameter providing greater spacing from conductors for greater capacitance, thus enabling higher resonance frequency, wherein a number of via steps and diameters selected for each barrel portion are based on a stack-up thickness of the PCB, material of the PCB, and desired frequency of operation.

* * * * *